United States Patent [19]

Tallant, II et al.

[11] Patent Number: 4,639,785
[45] Date of Patent: Jan. 27, 1987

[54] NON-SATURATING VIDEO OUTPUT AMPLIFIER

[75] Inventors: James C. Tallant, II, Noblesville City; Robert P. Parker, Indianapolis, both of Ind.

[73] Assignee: RCA Corporation, Princeton, N.J.

[21] Appl. No.: 593,094

[22] Filed: Mar. 26, 1984

[51] Int. Cl.$^4$ ............................................. H04N 5/68
[52] U.S. Cl. ..................................... 358/184; 358/34; 358/243
[58] Field of Search ................. 358/184, 156, 160, 34, 358/37, 166, 243, 74

[56] References Cited

U.S. PATENT DOCUMENTS

| 2,302,520 | 11/1942 | Bingley | 358/156 |
| 2,632,049 | 3/1953 | Druz | 358/156 |
| 2,829,197 | 4/1958 | Scott | 358/156 |
| 3,732,356 | 5/1973 | Matzek . | |
| 3,764,738 | 10/1973 | Zettl et al. | 358/160 |
| 4,118,731 | 10/1978 | Hinn | 358/184 X |
| 4,126,816 | 11/1978 | Willis | 315/411 |
| 4,197,558 | 4/1980 | Rutishauser | 358/184 X |
| 4,414,577 | 11/1983 | Tallant et al. | 358/242 |
| 4,463,385 | 7/1984 | Parker | 358/242 |
| 4,577,234 | 3/1986 | Harlan | 358/184 X |

FOREIGN PATENT DOCUMENTS 1385944  3/1975  United Kingdom .

OTHER PUBLICATIONS

Copending U.S. patent application of W. E. Harlan, Serial No. 547,325 filed Oct. 31, 1983, titled "Driver Amplifier for Image Display Device".

Primary Examiner—Michael A. Masinick
Assistant Examiner—E. Anne Toth
Attorney, Agent, or Firm—P. J. Rasmussen; P. M. Emanuel; R. H. Kurdyla

[57] ABSTRACT

In a television receiver, a non-saturating kinescope driver amplifier arrangement includes an input current limiter circuit coupled between a source of video signal and a current responsive signal input of a feedback kinescope driver amplifier. The limiter circuit, e.g., including a diode limiter, limits the magnitude of input signal currents applied to the current input of the amplifier to prevent the amplifier from exhibiting a saturated conductive state.

8 Claims, 1 Drawing Figure

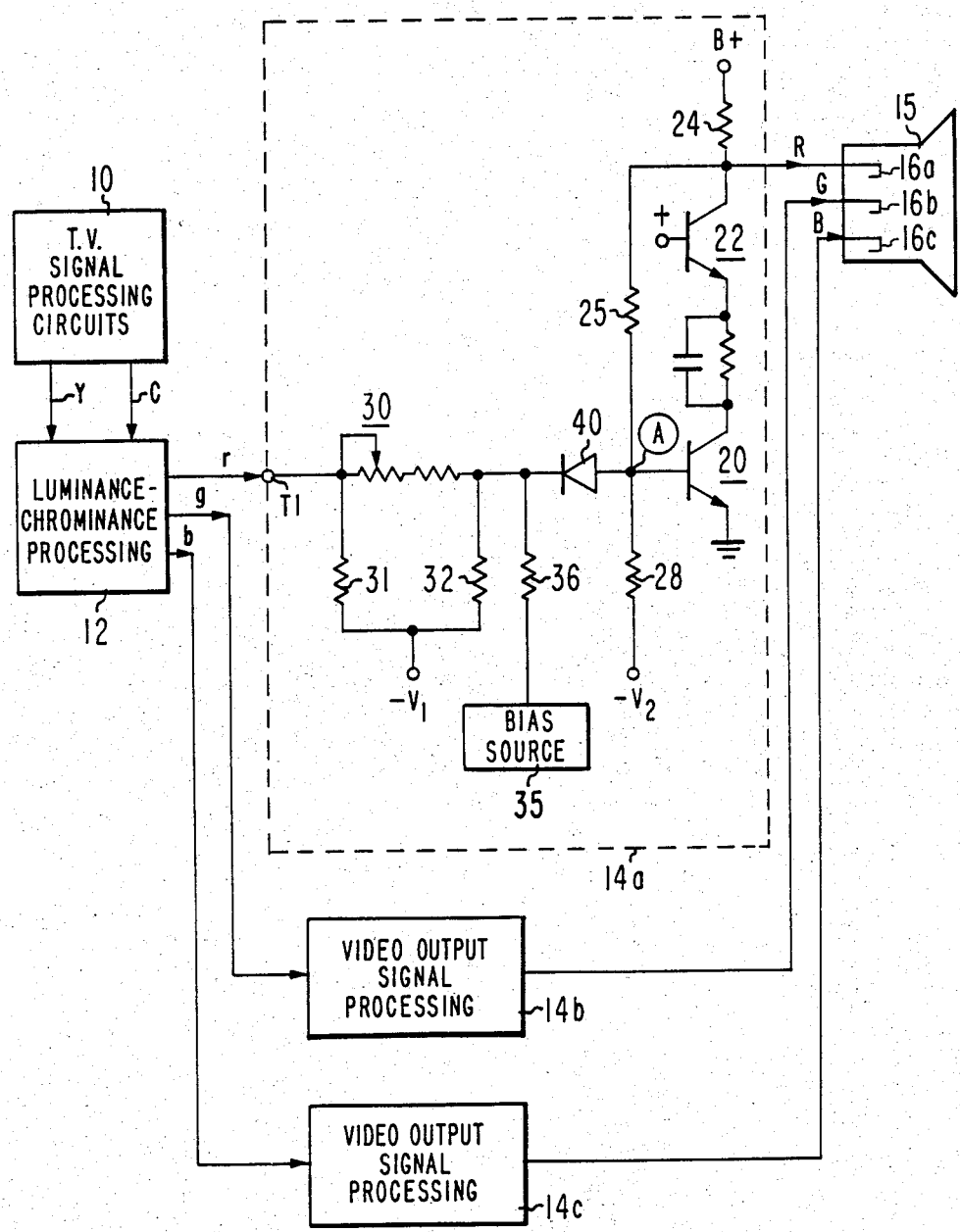

NON-SATURATING VIDEO OUTPUT AMPLIFIER

This invention concerns a video output amplifier for providing video drive signals to an image display device such as a kinescope in a color television receiver. In particular, this invention concerns an arrangement for preventing a video output amplifier from saturating in response to large video signals.

Plural video output amplifiers are used to provide high level amplified video signals to intensity control electrodes (e.g., cathodes) of a kinescope in a color television receiver. Output transistors of the driver amplifiers are subject to conducting in a saturated state in response to large amplitude video signals representative of highly saturated color image information, peak white image information, and image peaking at the edges of white image areas.

A saturated output amplifier can produce an objectionable white or colored image smear following a displayed image area produced by a large amplitude video drive signal. For example, if a white image area is displayed and the biasing of the red video output transistor is such that the red output transistor saturates, a red color smear following the white image area is likely to be produced as a result of the red video output transistor exhibiting a saturated conductive state together with the slow "recovery time" of the red output transistor due to transistor charge storage effects.

Output transistor saturation can be prevented by restricting the range of video drive signal amplitudes developed at the kinescope cathode. This is undesirable, however, since it leads to reduced image contrast for all displayed scenes.

Output transistor saturation can also be prevented by employing video output amplifier arrangements as disclosed in U.S. Pat. No. 3,732,356—Matzek, and in a copending U.S. patent application Ser. No. 547,325 of W. E. Harlan titled "Driver Amplifier for an Image Display Device", filed Oct. 31, 1983. The Matzek patent describes an arrangement wherein a diode signal limiter is used to voltage limit the amplitude of input video signals otherwise likely to cause the video output transistor to saturate. However, in the Matzek arrangement the diode limiting threshold is undesirably unpredictable since it is a function of the forward current gain parameter (Beta) of the output transistor, which can vary significantly from one transistor to another and with temperature. The Harlan arrangement comprises a video output amplifier with a non-linear feedback network including a switching device. The switching device modifies the impedance of the feedback network so as to reduce the signal gain of the output amplifier in the presence of large amplitude video signals otherwise capable of causing the output amplifier to saturate. However, it has been found that parasitic effects introduced by the feedback switching device can restrict the operating bandwidth of the output amplifier by an amount which may be unacceptable in some wide bandwidth applications, unless compensation is provided to restore the operating bandwidth.

Accordingly there is disclosed herein an economical arrangement for preventing video output amplifier saturation in a manner which exhibits more predictable operation compared to arrangements of the type described by Matzek, and which does not exhibit bandwidth-limiting effects of the type exhibited by the Harlan arrangement.

In accordance with the principles of the present invention, a non-saturating video output amplifier arrangement includes a signal limiting circuit coupled between a source of video signal and a current responsive signal input of a video output amplifier which provides an output signal voltage in response to an input signal current. The limiting circuit limits the magnitude of input signal currents otherwise likely to cause saturation of the video output amplifier.

In accordance with a feature of the invention, the video output amplifier comprises a feedback amplifier with a virtual ground signal input, and the limiting circuit is coupled between the video signal source and the virtual ground signal input.

The single FIGURE of the drawing shows a portion of a color television receiver including a video output amplifier arrangement in accordance with the principles of the present invention.

Television signal processing circuits 10 provide separated luminance (Y) and chrominance (C) components of a composite color television signal to a luminance-chrominance processor 12. Processor 12 includes gain control circuits, DC level setting circuits, color demodulators and matrix circuits for producing low level color image representative signals r, g and b. These signals are amplified by circuits within video output signal processing networks 14a, 14b, and 14c, respectively, which supply high level amplified color image signals R, G and B to respective cathode intensity control electrodes 16a, 16b, and 16c of a color kinescope 15. Since output signal processors 14a, 14b and 14c are similar in this embodiment, the following discussion of the structure and operation of processor 14a also applies to processors 14b and 14c.

Processor 14a includes a video output amplifier stage (i.e., a kinescope driver stage) comprising an input common emitter amplifier transistor 20, which receives video signal r from processor 12 via a terminal $T_1$ and an input signal coupling network as will be discussed. The amplifier stage also comprises a high voltage output common base amplifier transistor 22 which together with transistor 20 forms a cascode video output amplifier. High level video signal R, suitable for driving kinescope cathode 16a, is developed across a load resistor 24 in the collector output circuit of transistor 22. Direct current degenerative feedback for amplifier 20, 22 is provided by means of a feedback resistor 25 coupled from the collector output of transistor 22 to the base signal input of transistor 20 at node A, which represents a current summing junction. The base of transistor 20 is also coupled to a source of negative operating potential $-V_2$ via a resistor 28.

The input signal coupling network for transistor 20 comprises an adjustable resistor 30 which is coupled to a source of negative operating potential $-V_1$ via biasing resistors 31 and 32, and a normally conductive current limiter diode 40. Resistor 30 can be adjusted to set the signal gain for amplifier 20, 22. A positive bias voltage from a source 35 is coupled via a resistor 36 to the cathode electrode of diode 40. Source 35 can provide either a fixed or variable bias voltage, depending on the bias requirements of a given system. For example, source 35 can provide a variable DC control voltage for automatically controlling the bias of the video output amplifier in a receiver including a system for automatically maintaining a desired kinescope bias, as described in U.S. Pat. No. 4,414,577.

Input signal currents conducted from terminal T1 to diode 40 modulate the current otherwise conducted by diode 40, causing the collector output voltage of transistor 22 to vary with such input signal currents, until the input signal currents become large enough to render diode 40 non-conductive when a given current limiting saturation threshold is reached. At this time the base input current of transistor 20 is current limited whereby output transistor 22 is prevented from saturating. Driver 20, 22 essentially acts as an operational amplifier wherein the base current of transistor 20 is negligible, and the output voltage versus input current response of amplifier 20, 22 is substantially insensitive to the forward current gain parameter (Beta) of transistor 20. The collector output voltage of transistor 22 varies as a result of changes in the level of current conducted by feedback resistor 25 tracking with (ie., balancing) changes in the level of current conducted by diode 40. A more detailed circuit description follows immediately below.

Node A at the base of transistor 20 represents a virtual ground point, i.e., the quiescent base potential of transistor 20 corresponds to a relatively small, fixed potential equal to the sum of ground potential at the emitter of transistor 20 plus the substantially constant +0.7 voltage base-emitter junction offset voltage of transistor 20. The emitter of transistor 20 is connected to ground with substantially zero offset, and the bias voltage at the base of transistor 20 and at the anode of diode 40 corresponds to a relatively small, predictable voltage of approximately +0.7 volts. Feedback amplifier 20, 22 corresponds to an input current responsive amplifier for providing output signal voltage variations at the collector of transistor 22 in response to input signal current variations at node A. In this regard input signal voltages applied to terminal $T_1$, e.g., from the emitter output of an emitter follower transistor in the output circuit of processor 12, are converted to signal currents by means of the input signal coupling circuit comprising resistors 30, 31 and 32.

Normally conductive limiter diode 40 is biased so that it is rendered non-conductive in response to video signal input currents of a magnitude which would otherwise cause video output transistor 22 to exhibit a saturated conductive state. As the signal current conducted via terminal $T_1$ and resistor 30 to the cathode of diode 40 increases, the diode forward biasing current which flows from the anode to the cathode of diode 40 diminishes until such time as diode 40 is reverse biased in response to large signal currents, whereby further increases in video signal currents at node A are limited. The input current limiting level is established at a level just below that which would cause transistor 22 to saturate. The feedback current in resistor 25 and the collector output voltage of transistor 22 decrease as the conduction of limiter diode 40 decreases, and the collector output voltage of output transistor 22 is limited before the saturation point is reached when input signal currents are limited by the action of diode 40.

When diode 40 is non-conductive in the current limiting node, the amplifier output voltage ($V_o$) at the collector of transistor 22 is a function of the values of resistors 25, 28 and the magnitude of voltage $-V2$ according to the expression $$V_o = R25/R28^{(V2)}$$

Thus the values of resistors 28 and 25 can be tailored to achieve a desired minimum, non-saturated level of output voltage $V_o$ in the current limited mode. Output voltage $V_o$ can decrease below this level, i.e., in a saturated amplifier condition, only if signal current is forced into the virtual ground point at node A. Current limiter diode 40 prevents excessive signal currents from entering the virtual ground node, thus preventing a transistor 20 input signal drive condition which could otherwise cause output transistor 22 to conduct excessively in a saturated state. Bias current for diode 40 is provided by means of current conducted to diode 40 via feedback resistor 25, and resistor 32 sinks current conducted by diode 40. The value of resistor 32 is preferably chosen so that amplifier output voltage $V_o$ exhibits a maximum desired positive value when resistors 30 and 36 conduct no current.

What is claimed is:

1. A video signal processing system comprising:
   a source of video signal;
   an image display device responsive to video signals applied to an intensity control electrode thereof;
   a feedback driver amplifier with a signal input and a signal output for providing video drive signals to said intensity control electrode of said image display device, said amplifier including a feedback network with an impedance coupled from said signal output to said signal input;
   an input circuit coupled to said source, for providing video signals to said amplifier input; and
   a signal limiter included in said input circuit for limiting the magnitude of input signals greater than a given level to prevent saturation of said amplifier; said signal limiter being coupled between said source of video signal and said feedback impedance and having an input for receiving a bias current via a signal current path from said source, and an output for receiving a bias current via a signal path including said feedback impedance.

2. A system according to claim 1, wherein said signal input corresponds to a virtual ground point.

3. A system according to claim 1, wherein said limiter comprises a normally conductive diode coupled in series between said video signal source and said amplifier signal input, said diode being poled for forward current conduction such that increasing magnitudes of input signal currents from said source render said diode non-conductive at said given level.

4. A video signal processing system comprising:
   a source of video signal;
   an image display device responsive to video signals applied to an intensity control electrode thereof;
   a driver amplifier with a signal input and a signal output for providing video drive signals to said intensity control electrode of said image display device;
   an input circuit coupled to said source, for providing video signals to said amplifier input; and
   a signal limiter included in said input circuit for limiting the magnitude of input signals greater than a given level, to prevent saturation of said amplifier, said signal limiter having an input for receiving a bias current via a signal current path from said source, and an output; wherein said amplifier comprises
   a transistor having a base signal input electrode, a collector output electrode coupled to an output circuit including a load impedance, and an emitter electrode coupled to a a reference potential, said base input electrode corresponding to a virtual ground point; and a degenerative feedback network including a feedback resistor coupled from said output circuit to said virtual ground point at said base electrode; wherein said signal limiter is coupled between said source of video signal and said feedback resistor; and said output of said signal limiter receives a bias current via a signal path including said feedback resistor.

5. A system according to claim 4, wherein a source of bias potential is coupled via a resistor to said virtual ground point at said base electrode.

6. A system according to claim 4, wherein said emitter of said transistor is connected to ground reference potential with substantially zero offset, whereby the potential at said base electrode substantially corresponds to the base-emitter junction voltage of said transistor.

7. A system according to claim 4, wherein said limiter comprises a normally conductive diode coupled in series between said video signal source and said base electrode of said transistor, said diode being rendered non-conductive in response to input signals of a magnitude exceeding said given level.

8. A system according to claim 4, wherein said image display device corresponds to a kinescope with a cathode intensity control electrode.

* * * * *